(12) United States Patent
Chae

(10) Patent No.: US 6,639,359 B1
(45) Date of Patent: Oct. 28, 2003

(54) ORGANIC EL DISPLAY DEVICE HIGHER BRIGHTNESS AND A METHOD FOR MANUFACTURING THE SAME

(75) Inventor: Byung-Hoon Chae, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/950,614

(22) Filed: Sep. 13, 2001

(30) Foreign Application Priority Data

Oct. 11, 2000 (KR) ........................................ 2000-59746

(51) Int. Cl.$^7$ ................................................. H01J 1/62
(52) U.S. Cl. ........................ 313/506; 313/504; 313/113
(58) Field of Search ................................. 313/506, 504, 313/113, 114; 315/169.3; 428/917

(56) References Cited

U.S. PATENT DOCUMENTS 5,491,378 A * 2/1996 Lee et al. .................... 313/506
6,133,693 A * 10/2000 Keyser ......................... 313/506

* cited by examiner

*Primary Examiner*—Ashok Patel
(74) *Attorney, Agent, or Firm*—McGuireWoods LLP

(57) ABSTRACT

The present invention discloses an organic EL device, including a transparent substrate, at least one first electrodes disposed on the substrate, at least one conductive light reflecting layer disposed to cover at least one of side portions of the first electrode, at least one EL light-emitting layer disposed on the first electrode and generating light having a predetermined wavelength and at least one second electrode disposed on the EL light-emitting layer.

15 Claims, 26 Drawing Sheets

ORGANIC EL DISPLAY DEVICE HIGHER BRIGHTNESS AND A METHOD FOR MANUFACTURING THE SAME

BACKGROUND OF THE INVENTION

1. Field of the Invention

The present invention relates to an organic EL device and a method for manufacturing the same.

2. Description of Related Art

Organic EL devices are recently used in various industrial fields, for example, a back light device of a liquid crystal display (LCD) device, a portable terminal apparatus, an automobile navigator, a computer and a television, because of its rapid response speed, excellent brightness, simple structure, low production cost, and light weight, etc.

In order to configure the organic EL devices, first electrodes or transparent a electrodes are arranged on a thin transparent substrate, and an EL light-emitting layer that emits light by itself is disposed on the transparent electrodes before second electrodes are disposed on the EL light-emitting layer.

In the organic EL device having such a configuration, the transparent electrode has refractive index different from the substrate. Therefore, when light from the EL light-emitting layer passes through an interface between the transparent electrode and the substrate, light from the EL light-emitting layer is totally reflected due to the difference in the refractive index and is wave-guided to be lost. For example, the transparent electrode has a refractive index of about 1.8 to about 2.1, and the glass substrate has a refractive index of about 1.46. As a result, about 51% of light is lost while passing through an interface between the transparent electrode and the substrate, and about 31.5% of light is lost while passing through the substrate. Therefore, only 17.5% of light is viewed by observer.

17.5% of light is too low to display images. In order to compensate the reduced amount of light, more current is applied to the EL light-emitting layer because light from the EL light-emitting layer is proportional to the current intensity. Even though such a method can boost light amount, however, higher intensity of current reduces the life span of the EL light-emitting layer and increases power consumption.

SUMMARY OF THE INVENTION

To overcome the problems described above, preferred embodiments of the present invention provide an organic EL device having a high brightness.

It is another object of the present invention to provide an organic EL device of long life span.

It is also another object of the present invention to provide an organic EL device of low power consumption.

In order to achieve the above object, the preferred embodiments of the present invention provide an organic EL device, including a transparent substrate, at least one first electrodes disposed on the substrate, at least one conductive light reflecting layer disposed to cover at least one of side portions of the first electrode, at least one EL light-emitting layer disposed on the first electrode and generating light having a predetermined wavelength, and at least one second electrode disposed on the EL light-emitting layer.

The preferred embodiment of the present invention further provides an organic EL device, including a transparent substrate having a display region with a pixel region, first electrodes disposed on the display region of the substrate in a first direction and spaced apart from each other, conductive light reflecting layers disposed to expose top portions of the first electrode according to the pixel region of the substrate and covering both side portion of the first electrode parallel to the first direction, EL light-emitting layers disposed on the top portions of the first electrode according to the pixel region, and second electrodes disposed in a second direction perpendicular to the first direction while covering the EL light-emitting layers.

The preferred embodiment of the present invention further provides an organic EL device, including a transparent substrate, first electrodes having electrode patterns disposed in the form of a matrix, conductive light reflecting layers electrically connecting corresponding to electrode patterns to define the first electrode and exposing top portions of the electrode patterns of the first electrodes, EL light-emitting layers as disposed on the top portions of the electrode patterns of the first electrodes, and second electrodes disposed on the EL light-emitting layers and in a perpendicular direction to the first electrodes.

The preferred embodiment of the present invention further provides an organic EL device, including a transparent substrate, first electrodes having first electrode portions and second electrode portions, the first electrode portions being wider than the second electrode portions, conductive light reflecting layers disposed to cover at least one of side portions of the first electrodes, EL light-emitting layers disposed on the first electrode portions of the first electrodes, and second electrodes disposed on the EL light-emitting layers and in a perpendicular direction to the first electrodes.

The two conductive light reflecting layers are disposed to cover both side portions of the first electrodes. The conductive light reflecting layer is disposed to cover all side portions of the first electrodes. The conductive light reflecting layer is formed by either depositing or plating a metal layer. The device further includes an insulating layer disposed between the adjacent two first electrodes while covering the conductive light reflecting layer. The first electrodes have a beehive shape.

The preferred embodiment of the present invention provides a method for manufacturing an organic EL device having a transparent substrate having a display region, the display region having pixel regions, including forming first electrodes on the display region of the transparent substrate, forming conductive light reflecting layer to cover at least one side portion of the first electrodes, forming EL light-emitting layers on portions of the first electrodes corresponding to the pixel regions, and forming second electrodes disposed in a perpendicular direction to the first electrodes while covering the EL light-emitting layers.

The preferred embodiment of the present invention provides a method for manufacturing an organic EL device, including forming matrix-shaped first electrodes having electrode patterns on a transparent substrate, forming conductive light reflecting layer connecting the corresponding electrode patterns to define the first electrode and exposing top portions of the electrode patterns of the first electrodes, forming EL light-emitting layers on the top portions of the first electrodes, and forming second electrodes disposed in a perpendicular direction to the first electrodes and covering the EL light-emitting layers.

The method further includes forming insulating layers between the adjacent two first electrodes while covering the conductive light reflecting layer. The step of forming the conductive light reflecting layers includes depositing a metal layer over the whole surface while covering the first electrodes, and patterning the metal layer into the conductive light reflecting layers. The step of forming the conductive light reflecting layer includes, plating at least one side portion of the first electrode with a metal layer by immersing the substrate on which the first electrodes are formed into an electrobath filled with electrolyte. The first electrodes have first electrode portions and second electrode portions, the first electrode portion being wider than the second electrode portions. The EL light-emitting layer is formed on a top portion of the first electrode portion of the first electrode.

An organic EL device of higher brightness, longer life span, and lower power consumption can be manufactured.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts.

DETAILED DESCRIPTION OF PREFERRED EMBODIMENTS

Reference will now be made in detail to preferred embodiments of the present invention, example of which is illustrated in the accompanying drawings.

Figure 1:
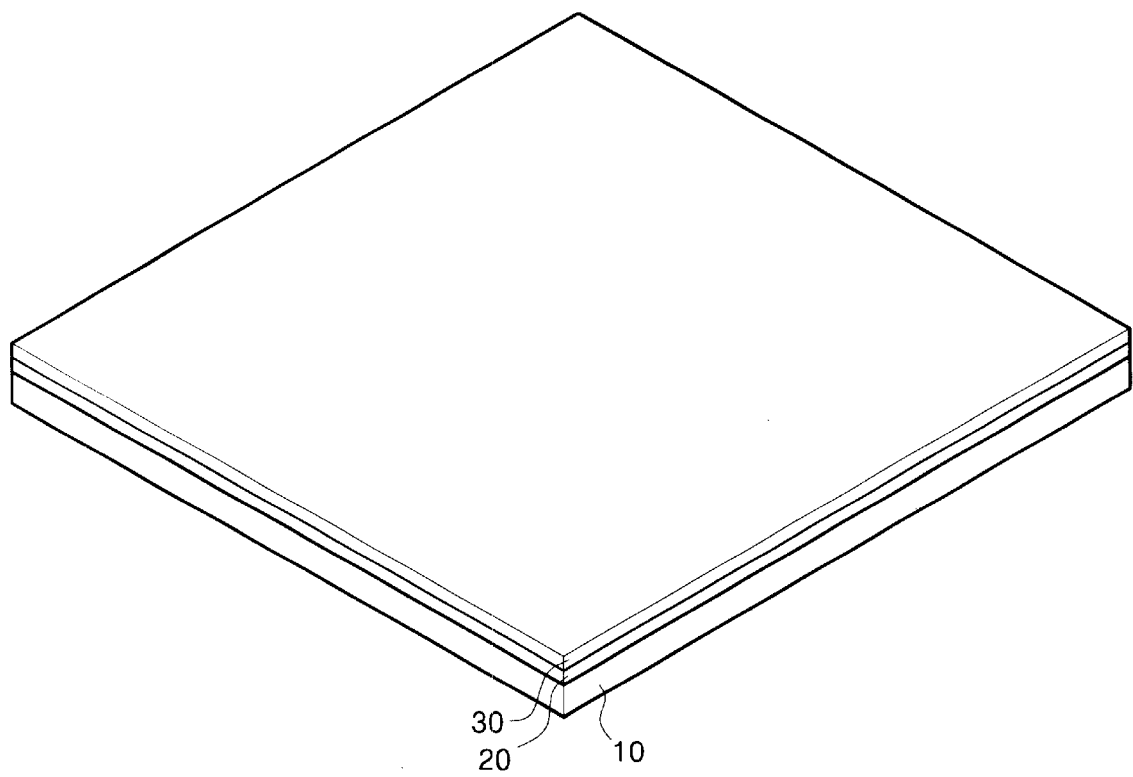
FIG. 1 is a perspective view illustrating a process of stacking an indium tin oxide layer and a photoresist layer sequentially on a substrate according to a first preferred embodiment of the present invention.

FIG. 1 is a perspective view illustrating a transparent substrate on which an indium tin oxide layer and a first photoresist are sequentially stacked according to a first embodiment of the present invention. The transparent substrate 10 is a very thin glass substrate. The indium tin oxide (hereinafter referred to as simply "ITO") layer 20 having a predetermined thickness is formed on the whole surface of the transparent substrate 10. Thereafter, the first photoresist 30 having a predetermined thickness is coated on the ITO layer 20.

Figure 2:
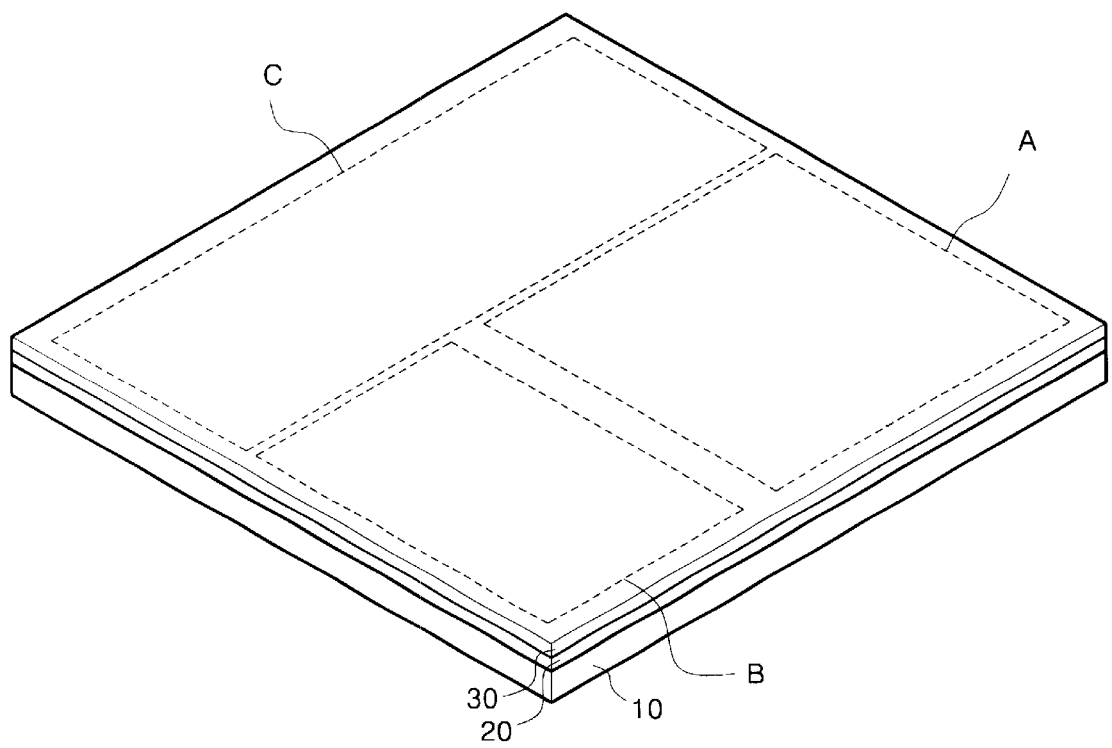
FIG. 2 is a perspective view illustrating a display region, an anode electrode lead region and a cathode electrode lead region defined on the substrate of FIG. 1.

At this time, as shown in FIG. 2, the substrate 10 is divided three regions: a display region A; an anode electrode lead region B; and a cathode electrode lead region C. Anode electrodes are formed on the display region A, and anode electrode leads are formed on the anode electrode lead region B. The cathode electrode leads are formed on the cathode electrode lead region C.

In order to form the anode electrodes, the anode electrode leads and the cathode electrode leads, the first photoresist 30 are patterned into photoresist patterns, and then the ITO layer 20 is etched according to the photoresist pattern.

Figure 3:
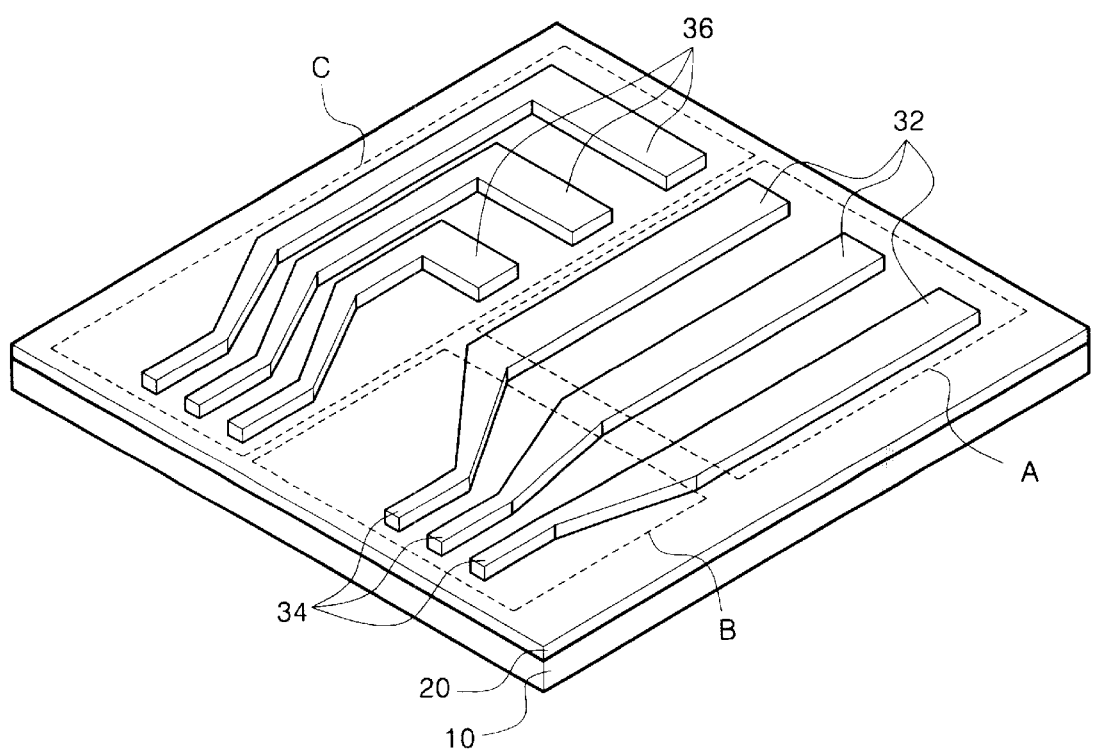
FIG. 3 is a perspective view illustrating a process of patterning the photoresist layer of FIG. 2 to form photoresist patterns.

In more detail, as shown in FIG. 3, a portion of the first photoresist 30 corresponding to the display region A is patterned into first photoresist patterns 32 of stripe-like shape. The first photoresist patterns are disposed in one direction and are parallel to each other. A portion of the first photoresist 30 corresponding to the anode electrode lead region B is patterned into second photoresist patterns 34. Each of the second photoresist patterns 34 is connected to the corresponding first photoresist pattern 32. Preferably, the first photoresist pattern 32 and the second photoresist pattern 34 are simultaneously formed through one mask process. Also, a portion of the first photoresist 30 corresponding to the cathode electrode lead region C is patterned into third photoresist patterns 36. The third photoresist pattern 36 is disposed in such a way that one end portion is perpendicular to the first photoresist pattern 32 and the other end portion is parallel to the second photoresist pattern 34. At this point, the first, second, and third photoresist patterns have three patterns, respectively, as shown in FIG. 3, but the number of the photoresist patterns is not limited to the present invention.

Figure 4:
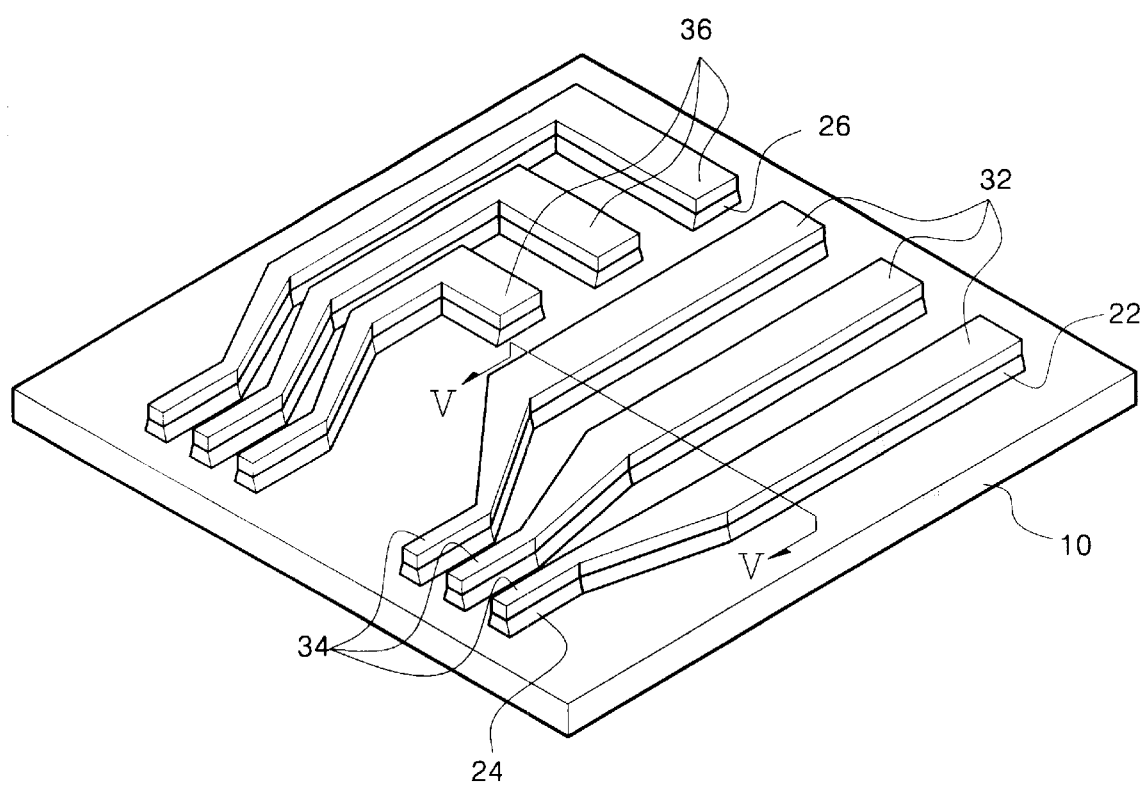
FIG. 4 is a perspective view illustrating a process of forming anode electrodes, anode electrode leads and cathode electrode leads according to the photoresist patterns of FIG. 3.
Figure 5:
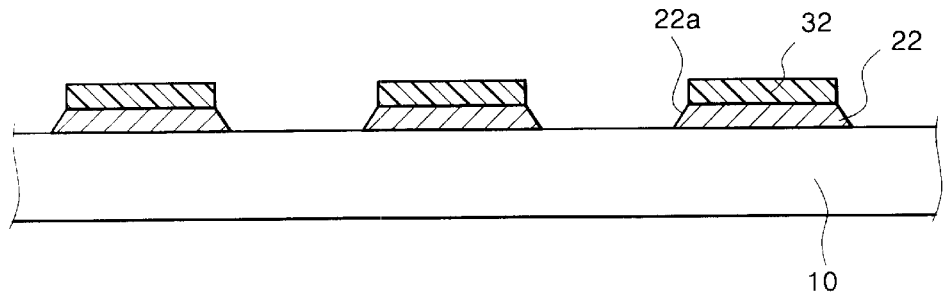
FIG. 5 is a cross-sectional view taken along line V—V of FIG. 4.
Figure 6:
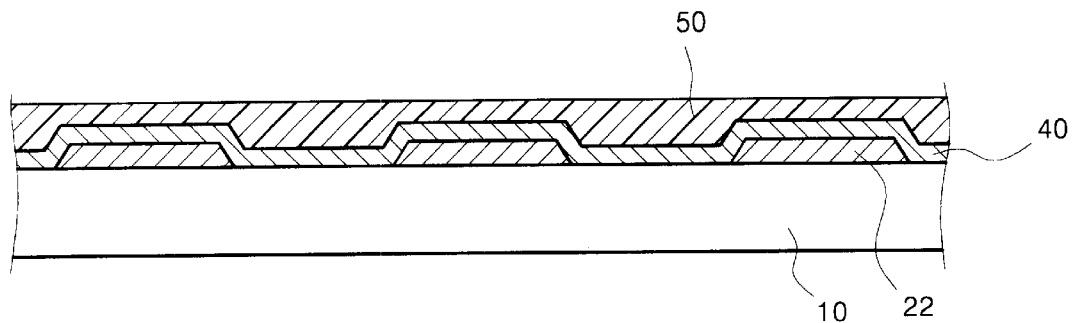
FIG. 6 is a cross-sectional view illustrating a process of depositing a metal layer and a photoresist layer.
Figure 7:
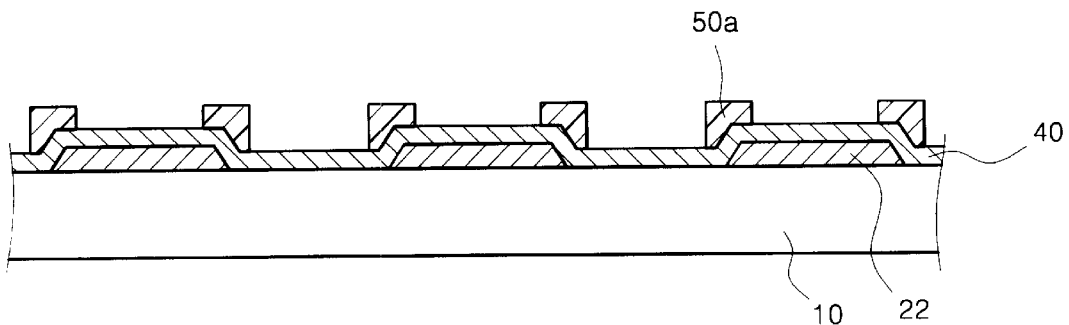
FIG. 7 is a cross-sectional view illustrating a process of patterning the photoresist layer of FIG. 6.

Subsequently, as shown in FIG. 4, the ITO layer 20 is wet or dry etched using the first photoresist pattern 32, the second photoresist pattern 34 and the third photoresist pattern 36 to form anode electrodes 22, anode electrode leads 24 and cathode electrode leads 26. At this moment, a composition ratio of an etchant or an etching gas is adjusted so that the anode electrodes 22 have a good taper angle, preferably, between 45° and 90° as shown in FIG. 5. The photoresist patterns 32, 34 and 36 are removed through an ashing process. FIGS. 5, 6 and 7 are cross-sectional views taken along line V—V of FIG. 4.

Then, as shown in FIG. 6, a metal layer 40 is deposited over the whole surface of the substrate 10 using a sputtering technique, and a second photoresist 50 are coated on the metal layer 40.

Figure 8:
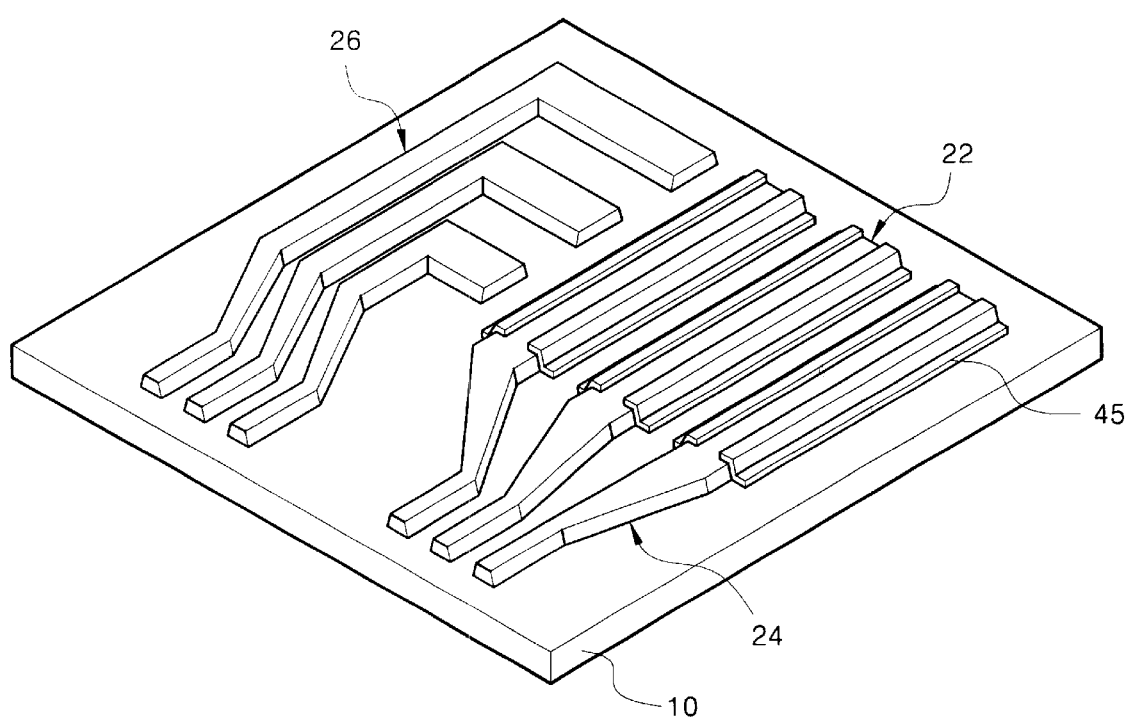
FIG. 8 is a perspective view illustrating a process of forming a conductive light reflecting layer.

As shown in FIG. 7, the second photoresist is patterned into fourth photoresist patterns 50a that covers portions of the metal layer 40 corresponding to both side portions 22a of the anode electrodes 22. The metal layer 40 is wet or dry etched using the forth photoresist patterns 50a, so that conductive light reflecting layers 45 covering both side portions 22a of the anode electrodes 22 are formed as shown in FIG. 8.

Figure 9:
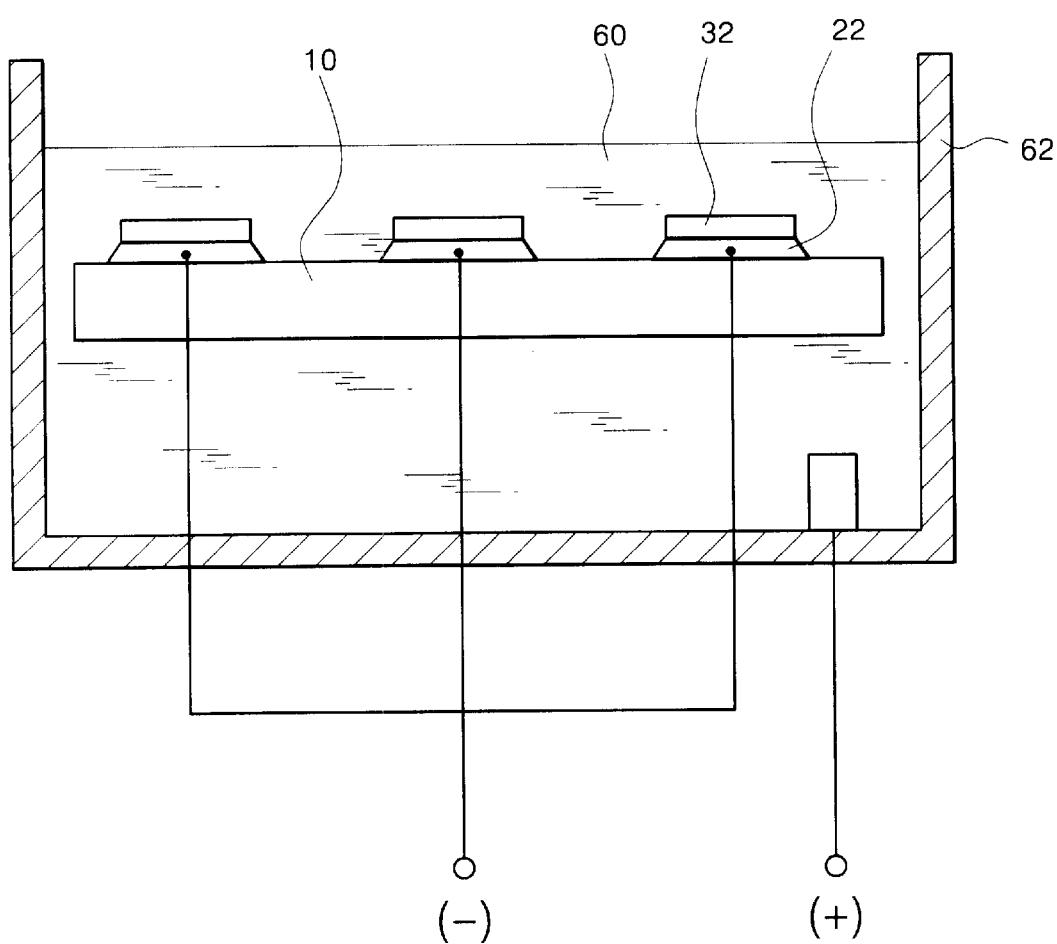
FIGS. 9, 10 and 11 are schematic diagrams illustrating another process of forming the conductive light reflecting layer.
Figure 10:
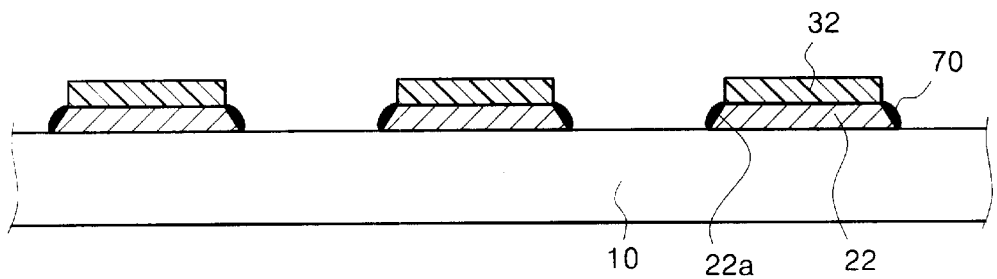
Figure 11:
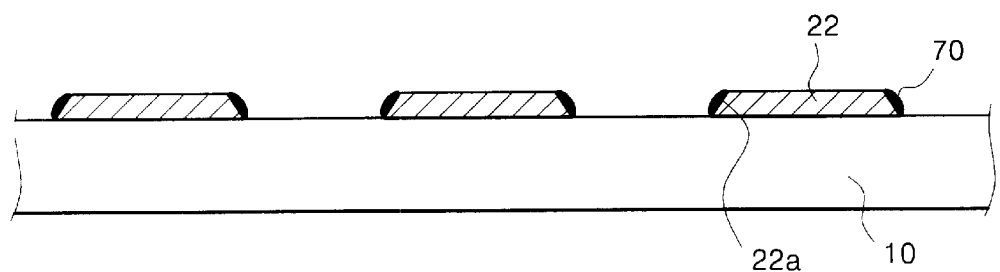

Meanwhile, another process of forming the conductive light reflecting layer 45 is shown in FIGS. 9, 10 and 11. As shown in FIG. 9, the substrate 10 of FIG. 4 on which the anode electrodes 22 and the first photoresist patterns 32 are formed is immersed into an electrobath 62 filled with electrolyte 60. The anode electrodes 22 are connected with a negative pole, and the electrolyte 60 is connected with a positive pole. In this state, to voltages are applied so that the anode electrodes 22 and the anode electrode leads 24 are plated with a metal material to a predetermined thickness. At this moment, since the first photoresist patterns 32 are formed on the anode electrodes 22, a conductive metal is plated on both side portions 22a of the anode electrodes 22 in a predetermined thickness to form a conductive light reflecting layer 70. The first photoresist patterns 32 are removed through an ashing process as shown in FIG. 10. The conductive light reflecting layer 70 of FIG. 11 performs the same function as the conductive light reflecting layer 45 of FIG. 8. Hereinafter, the first preferred embodiment of the present invention is explained focusing on the conductive light reflecting layer 45 of FIG. 8.

Figure 12:
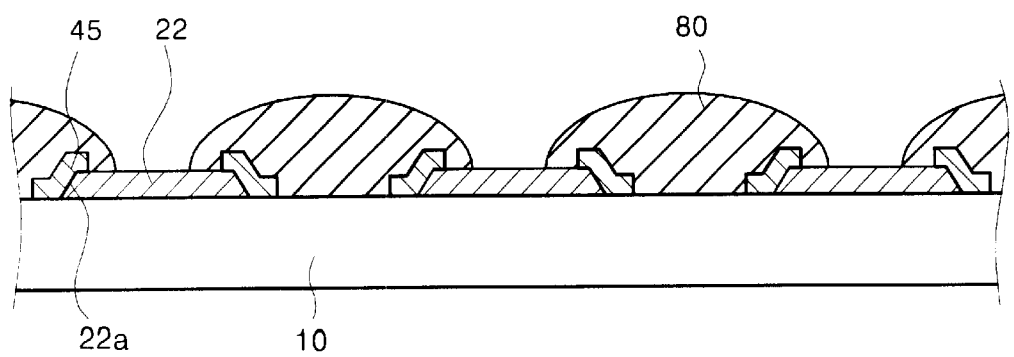
FIG. 12 is a cross-sectional view illustrating a process of forming an insulating layer.

Returning now to FIG. 12, insulating layers 80 are formed between the adjacent two anode electrodes 22 while covering the adjacent two conductive light reflecting layers 45. The insulating layers 80 is formed to prevent the adjacent two conductive light reflecting layers 45 from being circuit-shorted when more anode electrodes 22 are formed to implement a high resolution and therefore a distance between the adjacent two anode electrodes 22 becomes narrowed.

Subsequently, an EL light-emitting layers for generating three primary light (i.e., red, blue and green) are deposited on the anode electrodes 22. At this point, an EL light-emitting layer for generating red light is called a red EL light-emitting layer, and an EL light-emitting layer for generating blue light is called a blue EL light-emitting layer, and an EL light-emitting layer for generating green light is called a green EL light-emitting layer. A process of forming the red, blue and green EL light-emitting layers is explained with reference to FIGS. 13, 14, 15, 16, 17 and 18.

Figure 13:
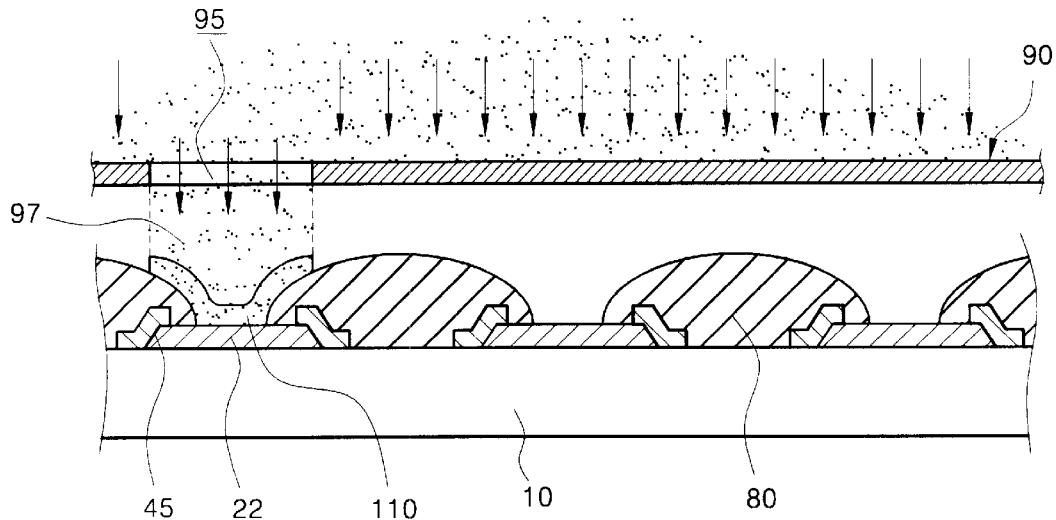
FIGS. 13, 14, 15, 16, 17 and 18 are schematic diagrams illustrating a process of forming an EL light-emitting layer.
Figure 14:
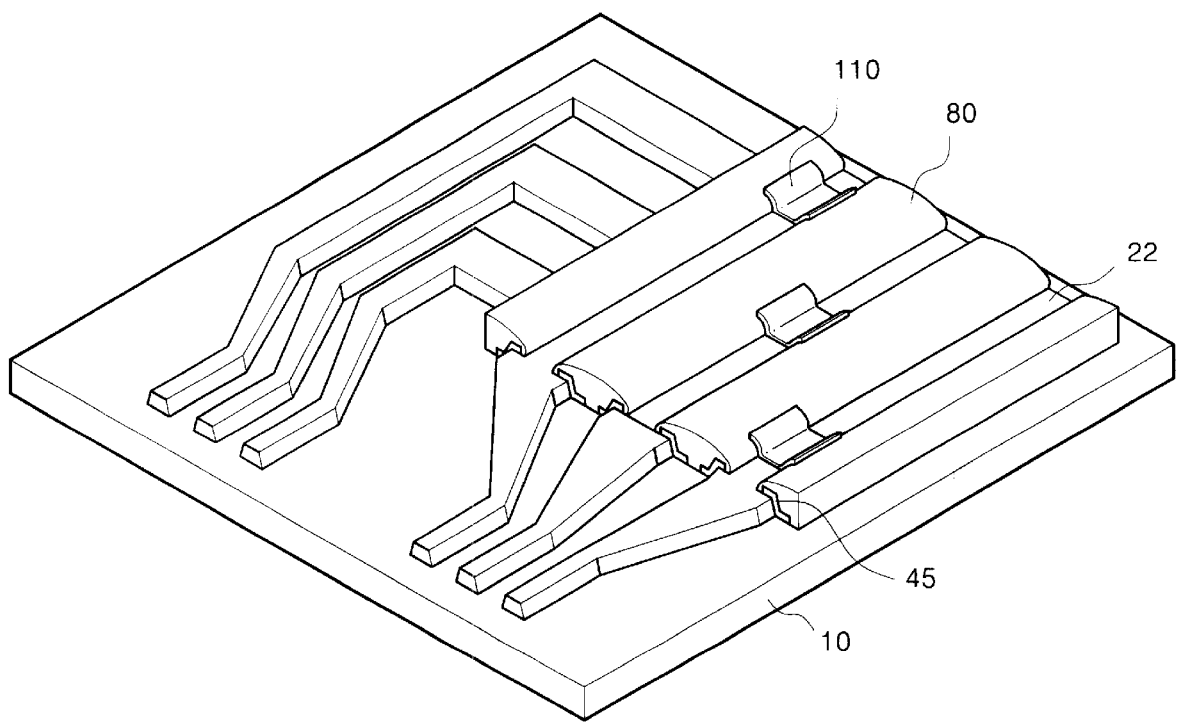

First, as shown in FIG. 13, a first mask 90 having an opening portion 95 is aligned with the substrate 10. The opening portion 95 of the first mask 90 is disposed on a location corresponding to the red EL light-emitting layer. A red EL light-emitting material 97 is deposited through the opening portion 95 of the first mask 90, for example, by a vacuum deposition. Thus, the red EL light-emitting layers 110 are formed on portions of the anode electrode 22 corresponding to the opening portion 95 of the first mask 90 as shown in FIG. 14.

Figure 15:
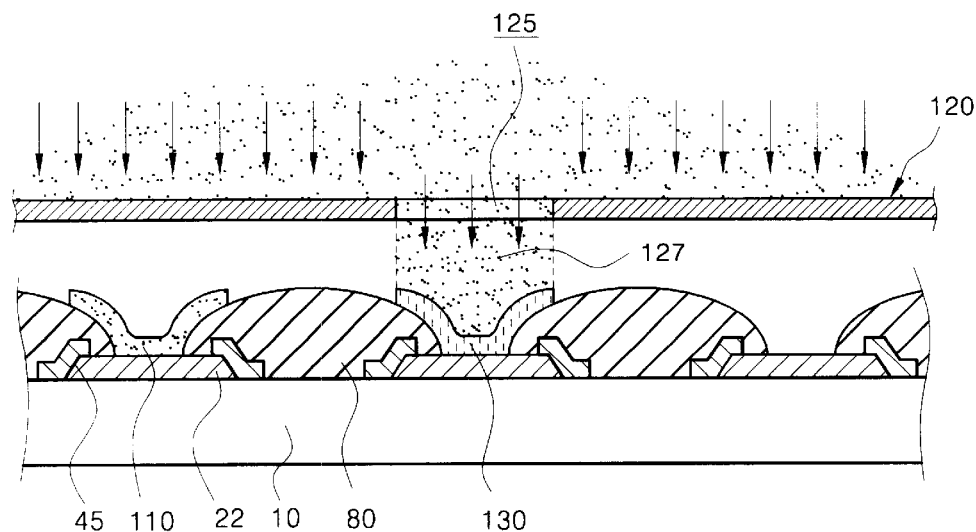
Figure 16:
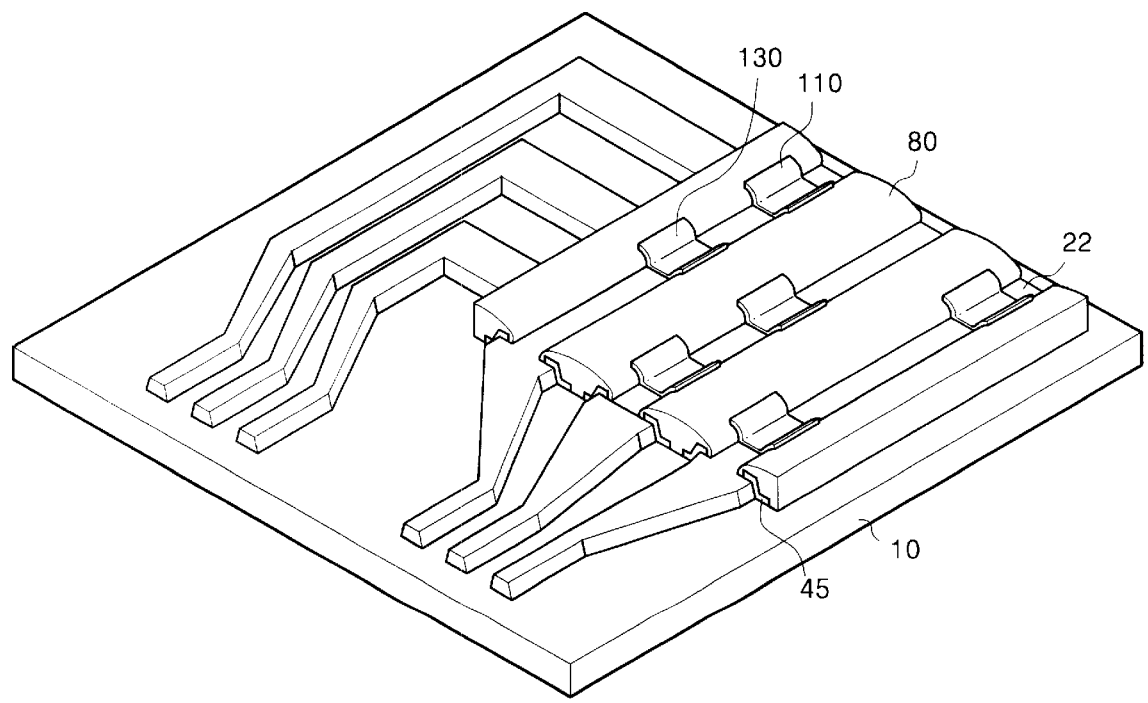

After forming the red EL light-emitting layer 110, as shown in FIG. 15, a second mask 120 having an opening portion 125 is aligned with the substrate 10. The opening portion 125 of the first mask 120 is disposed on a location corresponding to the blue EL light-emitting layer. A blue EL light-emitting material 127 is deposited through the opening portion 125 of the first mask 120, for example, by a vacuum deposition. And the blue EL light-emitting layers 130 are formed on portions of the anode electrode 22 corresponding to the opening portion 125 of the first mask 120 as shown in FIG. 16.

Figure 17:
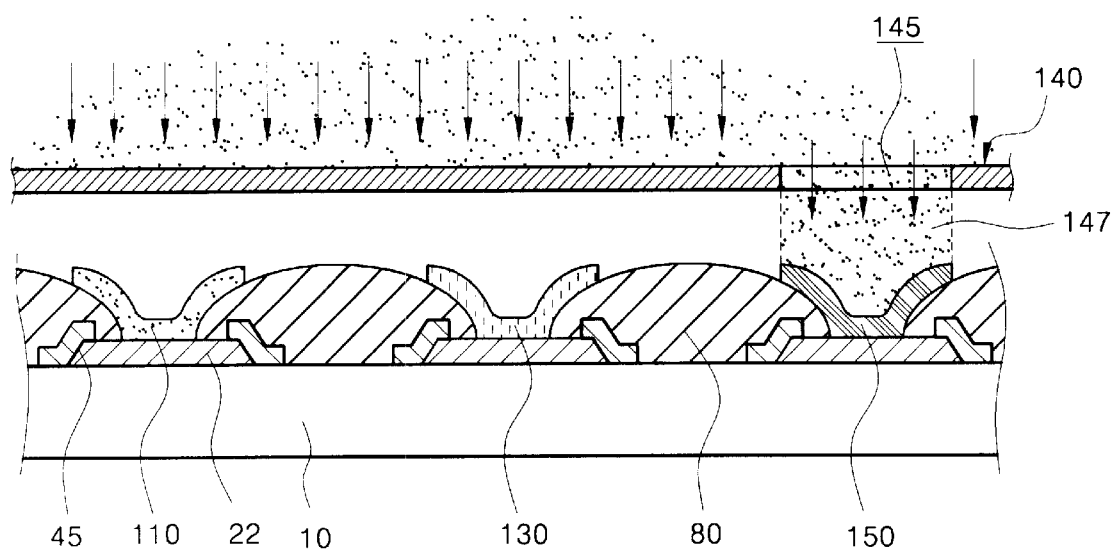
Figure 18:
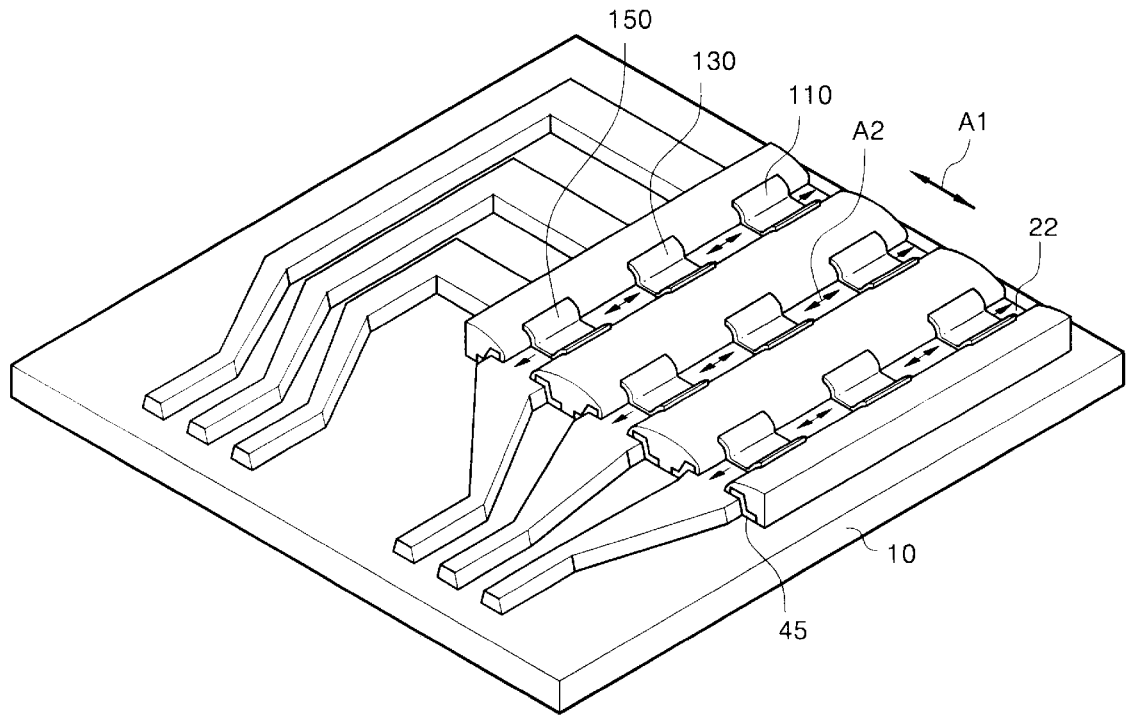

Using the same method, as shown in FIG. 17, a third mask 140 having an opening portion 145 is aligned with the substrate 10. The opening portion 145 of the first mask 140 is disposed on a location corresponding to the green EL light-emitting layer. A green EL light-emitting material 147 is deposited through the opening portion 145 of the first mask 140, for example, by a vacuum deposition. Thus, the green EL light-emitting layers 150 are formed on portions of the anode electrode 22 corresponding to the opening portion 145 of the first mask 140 as shown in FIG. 18.

In the first preferred embodiment of the present invention, the red, blue and green EL light-emitting layers 110, 130 and 150 are formed using the masks 90, 120 and 140. However, a photoresist pattern having opening portions disposed on locations corresponding to the red, blue and green EL light-emitting layers 110, 130 and 150 is deposited, and then the red, blue and green EL light-emitting materials 97, 127 and 147 are deposited on portions of the anode electrodes 22 corresponding to the opening portions of the photoresist pattern using a spin coating technique.

Figure 19:
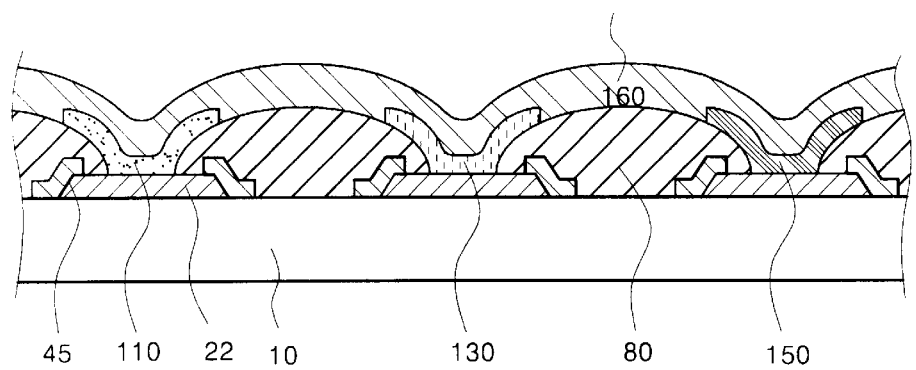
FIG. 19 is a cross-sectional view illustrating a process of forming a cathode electrode.

Subsequently, as shown in FIG. 19, a metal layer is deposited over the whole IFS surface of the substrate 10 and is patterned into cathode electrodes 160. The cathode electrodes 160 are disposed in a perpendicular direction to the anode electrodes 22. Each of the cathode electrodes 160 is electrically connected with the corresponding cathode electrode lead 26 and electrically connects the corresponding red, blue and green EL light-emitting layers 110, 130 and 150.

In the organic EL device having such a configuration, when a forward current is applied to the anode and cathode electrodes 22 and 160, the red, blue and green EL light-emitting layers 110, 130 and 150 generate light having a predetermined wavelength, respectively, by combining electrons and holes. Then, red light, blue light and green light generated are emitted toward an external portion through the anode electrode 22 and the substrate 10. At this moment, since the anode electrode 22 has refractive index different from the substrate 10, (part of light from the EL light-emitting layer is reflected from the interface between the anode electrode 22 and the substrate 10. Reflected light is reflected again by the conductive light reflecting layer 45 and is directed toward an interface between the anode electrode 22 and the substrate 10. Such a reflection is repeated, thereby increasing an amount of light emitted toward the substrate 10 significantly. Also, light passing through the substrate 10 is reflected from an interface between the substrate and air, such a reflected light is re-reflected from the conductive light reflecting layer 45, thereby increasing an amount of light viewed by observer. As a result, an organic EL device having a high brightness can be achieved.

In the first preferred embodiment of the present invention described above, as shown in FIG. 18, the conductive light reflecting layer cannot prevent the loss of light that is wave-guided in a direction of an arrow A2, but can prevent the loss of light that is wave-guided in a direction of an arrow A1. A second preferred embodiment of the present invention is directed to an organic EL device to prevent the loss of light that is wave-guided in a longitudinal direction of the anode electrode.

Figure 20:
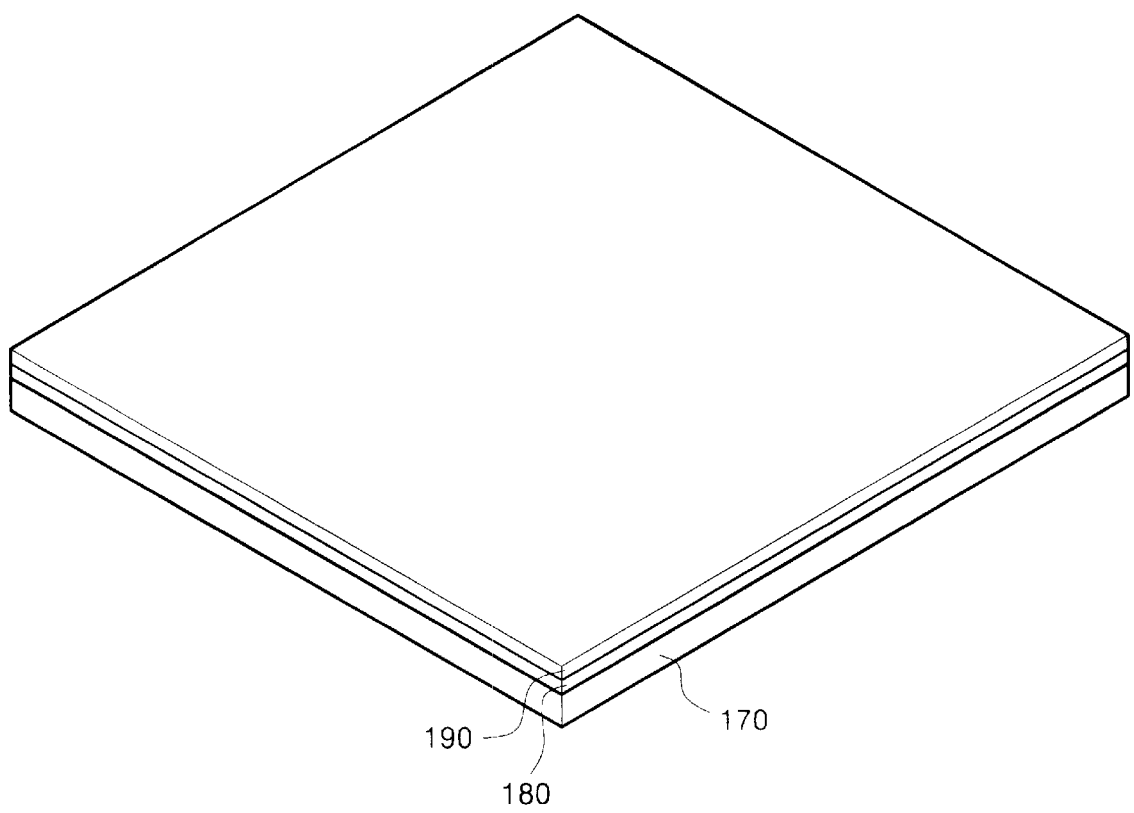
FIG. 20 is a perspective view illustrating a process of stacking an indium tin oxide layer and a photoresist layer sequentially on a substrate according to a second preferred embodiment of the present invention.

FIG. 20 is a perspective view illustrating a transparent substrate on which an ITO layer and a first photoresist are sequentially stacked according to a second embodiment of the present invention. The transparent substrate 170 is a very thin glass substrate. The ITO layer 180 having a predetermined thickness is formed on the whole surface of the transparent substrate 170. Thereafter, the first photoresist 190 having a predetermined thickness is coated on the ITO layer 180.

Figure 21:
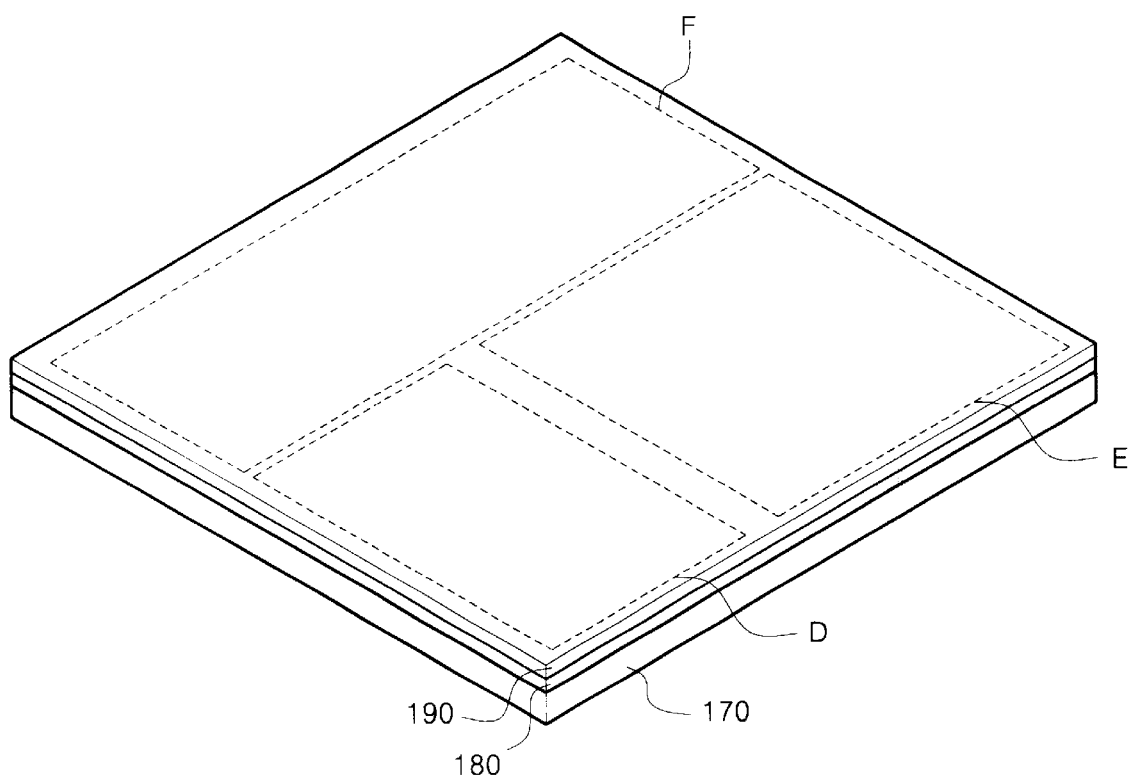
FIG. 21 is a perspective view illustrating a display region, an anode electrode lead region and a cathode electrode lead region defined on the substrate of FIG. 20.

At this time, as shown in FIG. 21, the substrate 170 is divided into three regions: a display region E; an anode electrode lead region D; and a cathode electrode lead region F. Anode electrodes are formed on the display region E, and anode electrode leads are formed on the anode electrode lead region D, and cathode electrode leads are formed on the cathode electrode lead region F.

In order to form the anode electrodes, the anode electrode leads and the cathode electrode leads, the first photoresists 190 are patterned into photoresist patterns, and then the ITO layer is etched according to the photoresist pattern.

Figure 22:
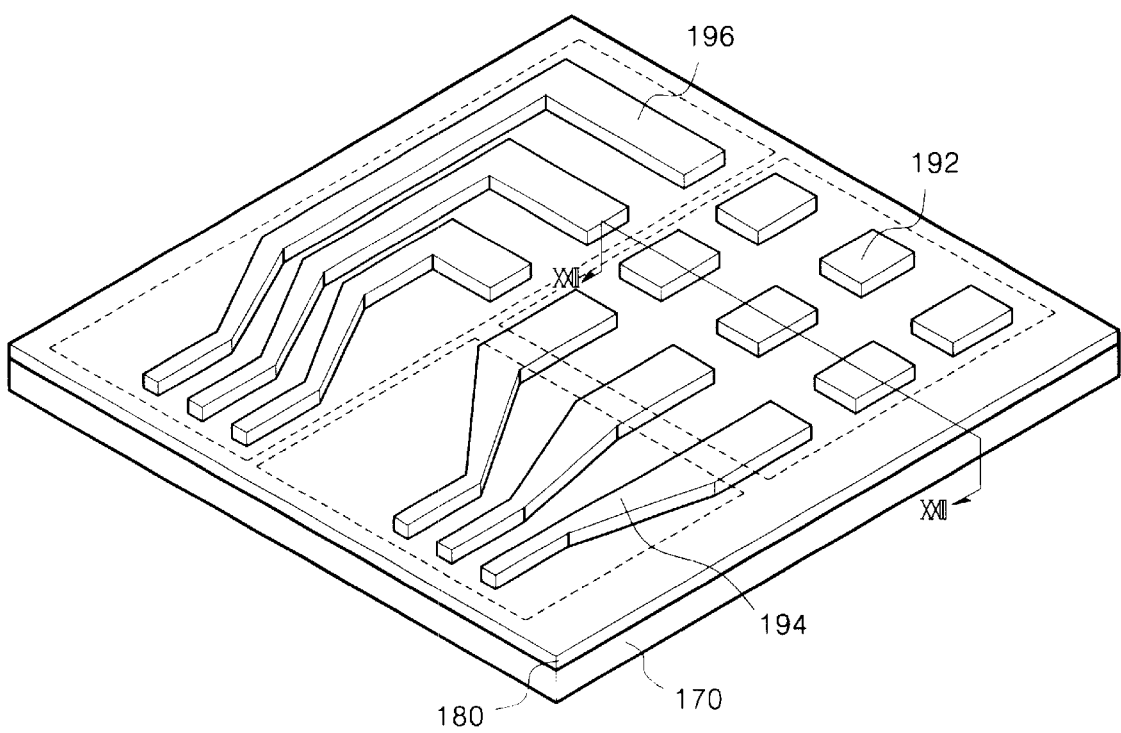
FIG. 22 is a perspective view illustrating a process of forming photoresist patterns.
Figure 23:
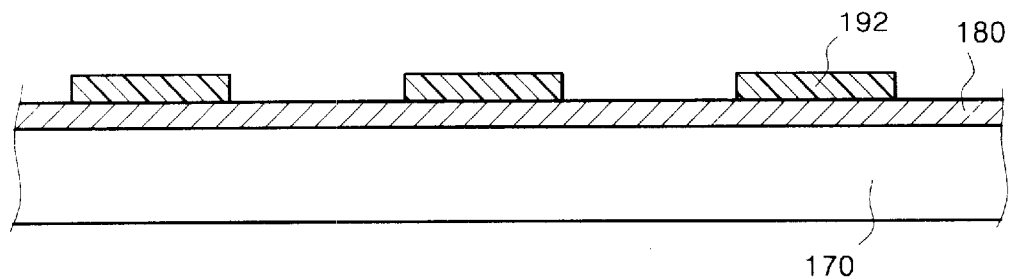
FIG. 23 is a cross-sectional view taken along line XXIII—XXIII of FIG. 22.

For more detail, as shown in FIG. 22, a portion of the first photoresist 190 corresponding to the display region D is patterned into first photoresist patterns 192 in the form of a matrix. The adjacent two first photoresist patterns are spaced apart from each other. A portion of the first photoresist 190 corresponding to the anode electrode lead region E is patterned into second photoresist patterns 194. Each of the second photoresist patterns 34 is connected with the most adjacent photoresist patterns of the corresponding first photoresist pattern 32. Preferably, the first photoresist pattern 192 and the second photoresist pattern 194 are simultaneously formed in one mask process. Also, a portion of the first photoresist 190 corresponding to the cathode electrode lead region F is patterned into third photoresist patterns 196. The third photoresist pattern 196 is disposed in such a way that one end portion is perpendicular to the first photoresist pattern 192 and the other end portion is parallel to the second photoresist pattern 194. At this point, the first, second and third photoresist patterns 192, 194 and 196 have three patterns, respectively, as shown in FIG. 22, but the number of the photoresist patterns is not limited to the present invention. FIG. 23 is a cross-sectional views taken along line XXIII—XXIII of FIG. 22.

Figure 24:
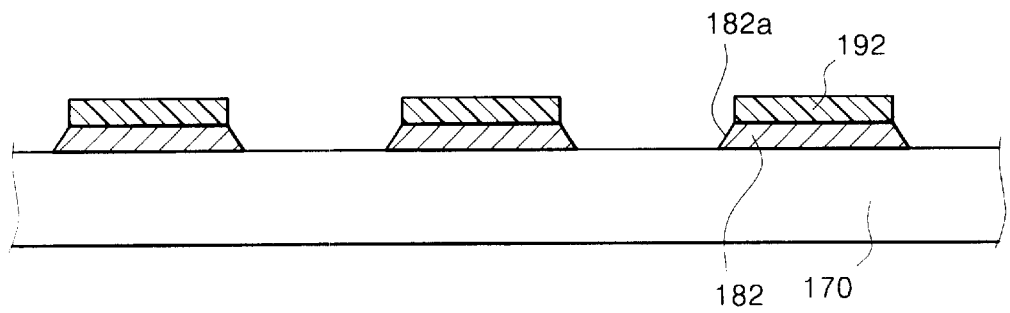
FIG. 24 is a cross-sectional view illustrating a process of forming anode electrodes, anode electrode leads and cathode electrode leads.

Subsequently, as shown in FIG. 24, the ITO layer 180 is wet or dry etched using the first photoresist pattern 192, the second photoresist pattern 194 and the third photoresist pattern 196, to form anode electrodes 182, anode electrode leads 184 and cathode electrode leads 186. At this moment, a composition ratio of an etchant or an etching gas is adjusted so that the anode electrodes 22 have a taper angle between 450 and 900 as shown in FIG. 24. The photoresist patterns 192, 194 and 196 are removed through an ashing process.

Figure 25:
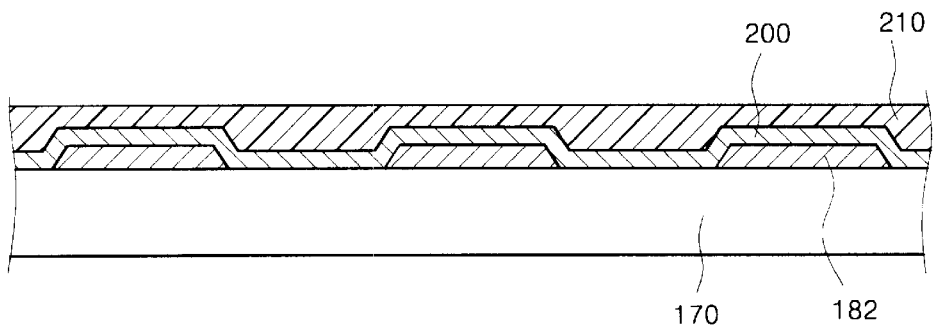
FIG. 25 is a cross-sectional view illustrating a process of depositing a metal layer and a photoresist layer.
Figure 26:
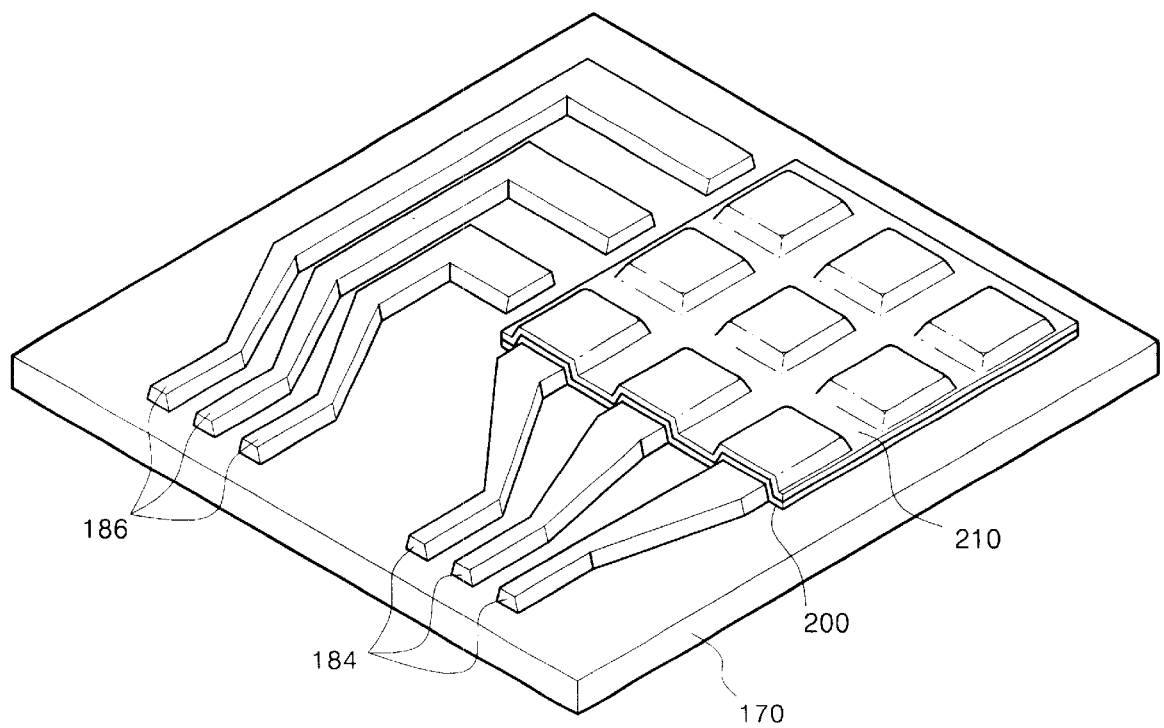
FIG. 26 is a perspective view of FIG. 25.

Then, as shown in FIGS. 25 and 26, a metal layer 200 is deposited over the whole surface of the substrate 170 using a sputtering technique, and a second photoresist 210 is coated on the metal layer 200.

Figure 27:
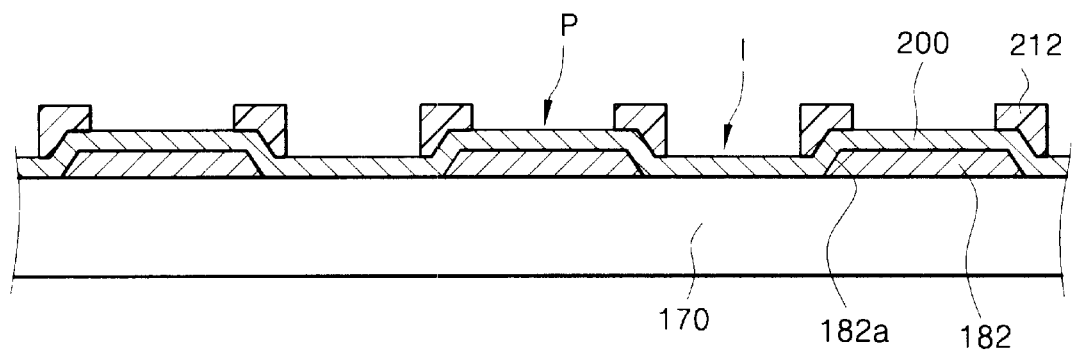
FIG. 27 is a cross-sectional view illustrating a process of patterning the photoresist layer of FIG. 25.

As shown in FIG. 27, the second photoresist is patterned into fourth photoresist patterns 212 to expose portions of the metal layer 200 corresponding to pixel regions P and interval portions I of the metal layer 200 between the adjacent two anode electrodes 182.

Figure 28:
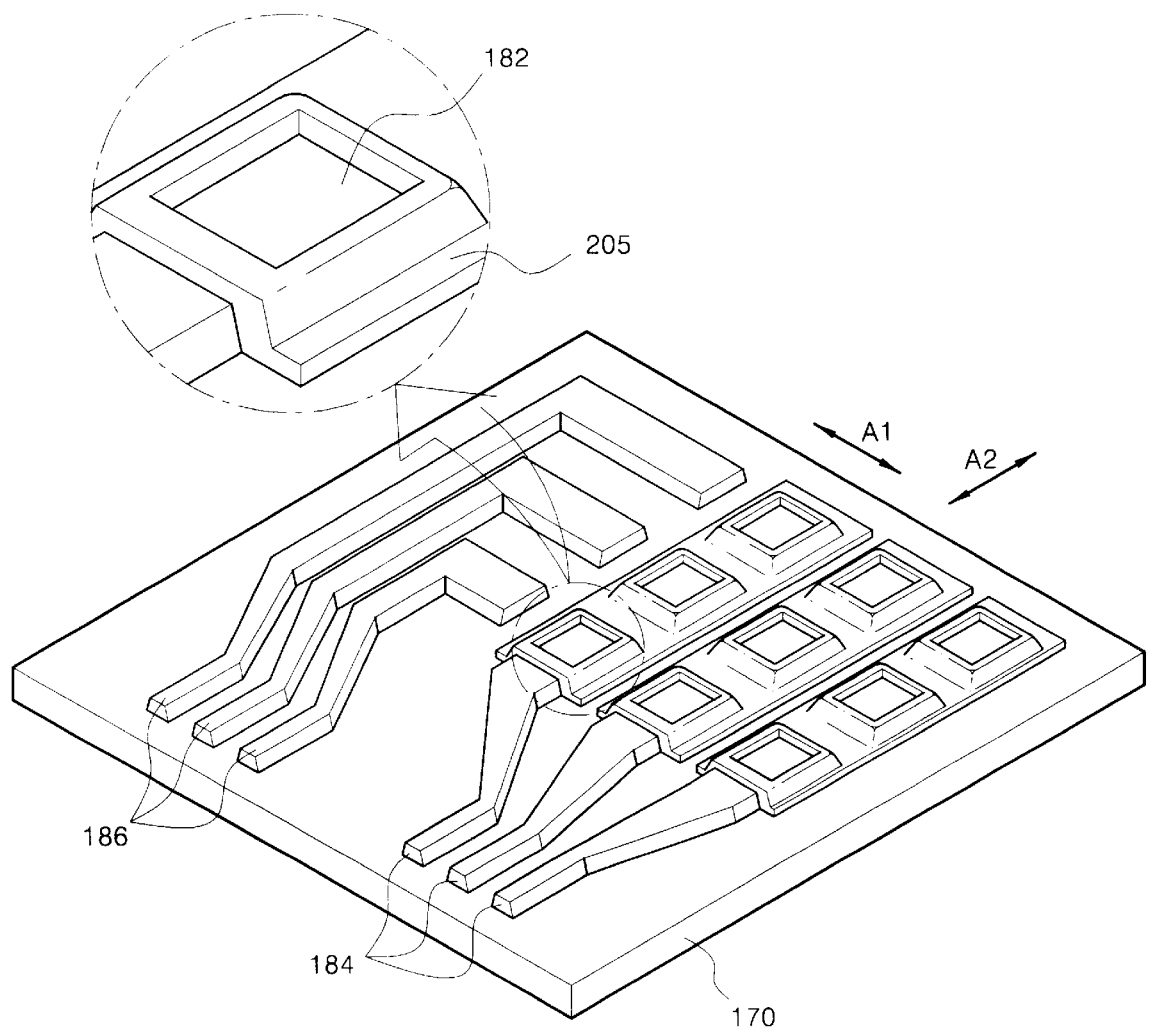
FIG. 28 is a perspective view illustrating a process of forming a conductive light reflecting layer.

The metal layer 200 is wet or dry etched using the fourth photoresist patterns 212. Then, the fourth photoresist patterns 192 are removed through an ashing process. Now, conductive light reflecting layers 205 that connects the anode electrodes 182 corresponding to the same anode electrode lead 184 are formed as shown in FIG. 28. The conductive light reflecting layers 205 are electrically disconnected to each other. The conductive light reflecting layers 205 of such a configuration repeatedly reflects light that is reflected from the interface between the anode electrode and the substrate, thereby increasing the brightness. In other words, since not only light wave-guided in a direction of the arrow A1 but also light wave-guided in a direction of the arrow A2 is reflected again by the conductive light reflecting layer 205, the amount of light viewed by observer becomes increased, leading to higher brightness.

Figure 29:
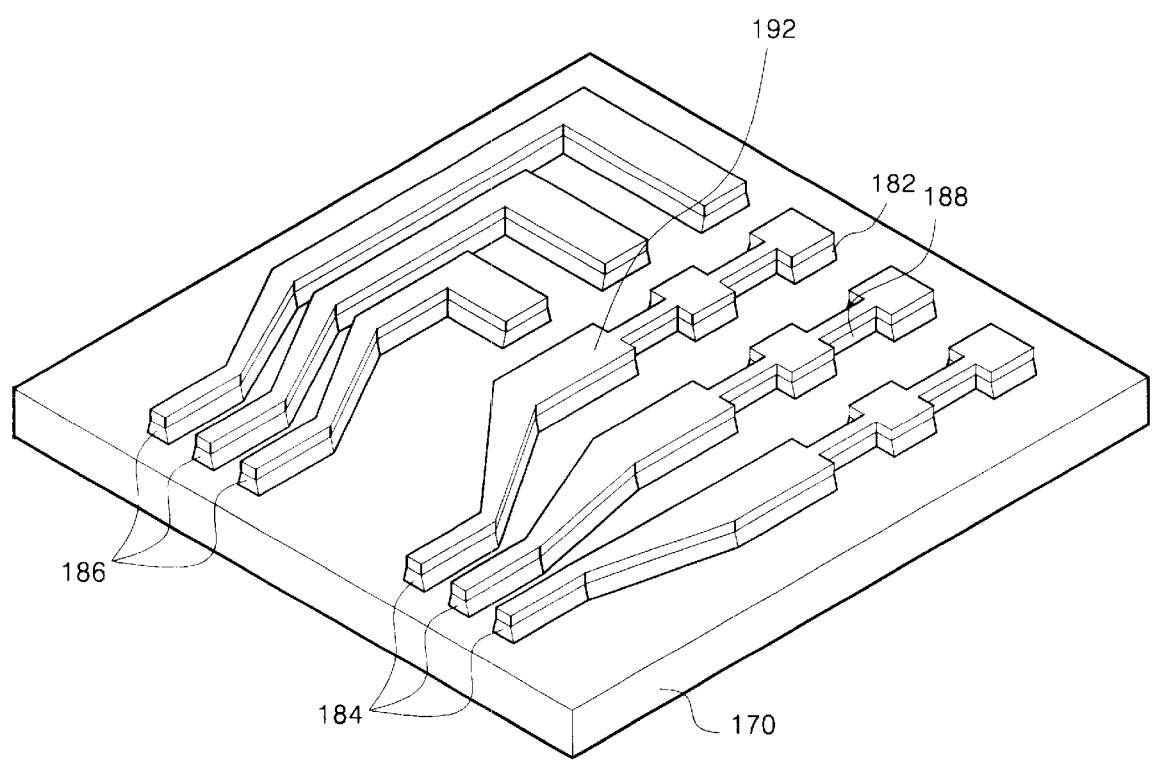
FIG. 29 is a perspective view illustrating modified anode electrodes.
Figure 30:
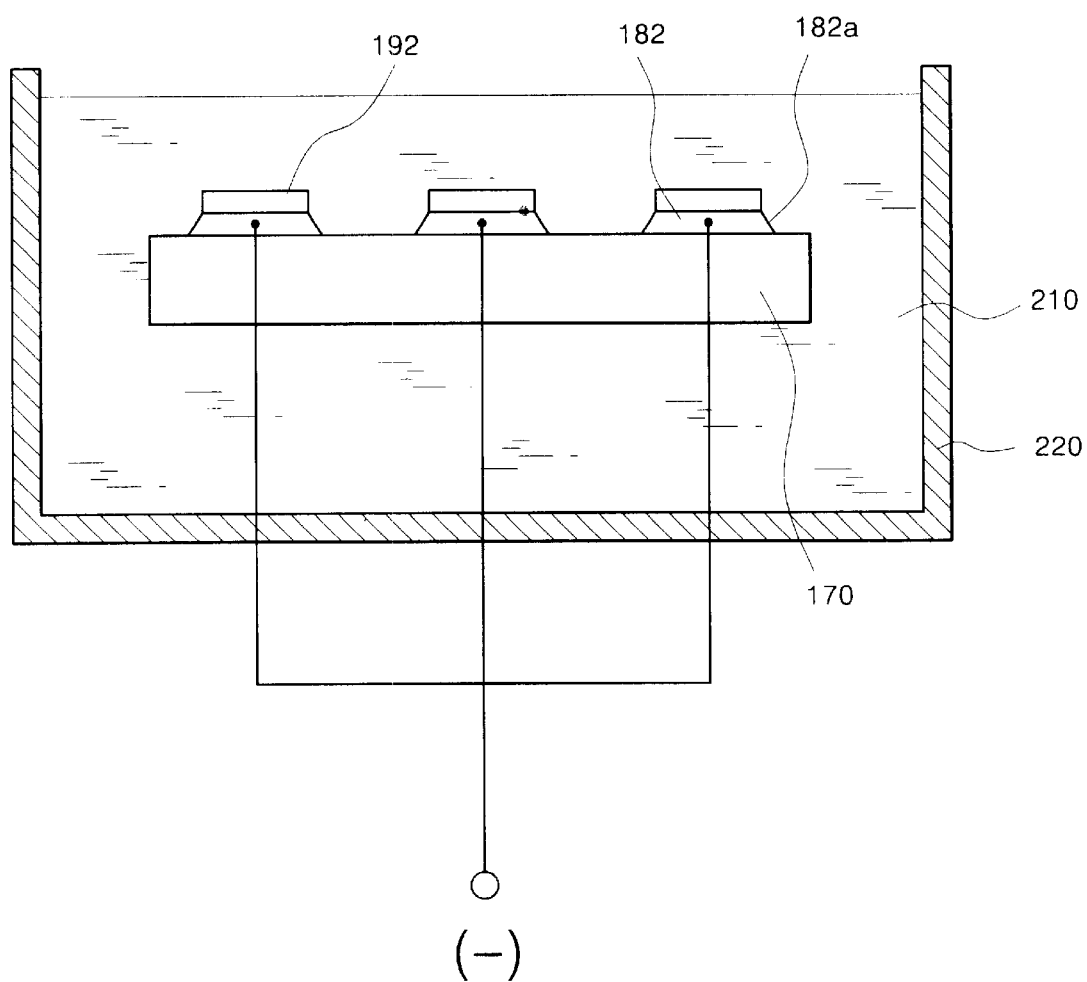
FIGS. 30, 31 and 32 are processing views illustrating another process of forming the conductive light reflecting layer.
Figure 31:
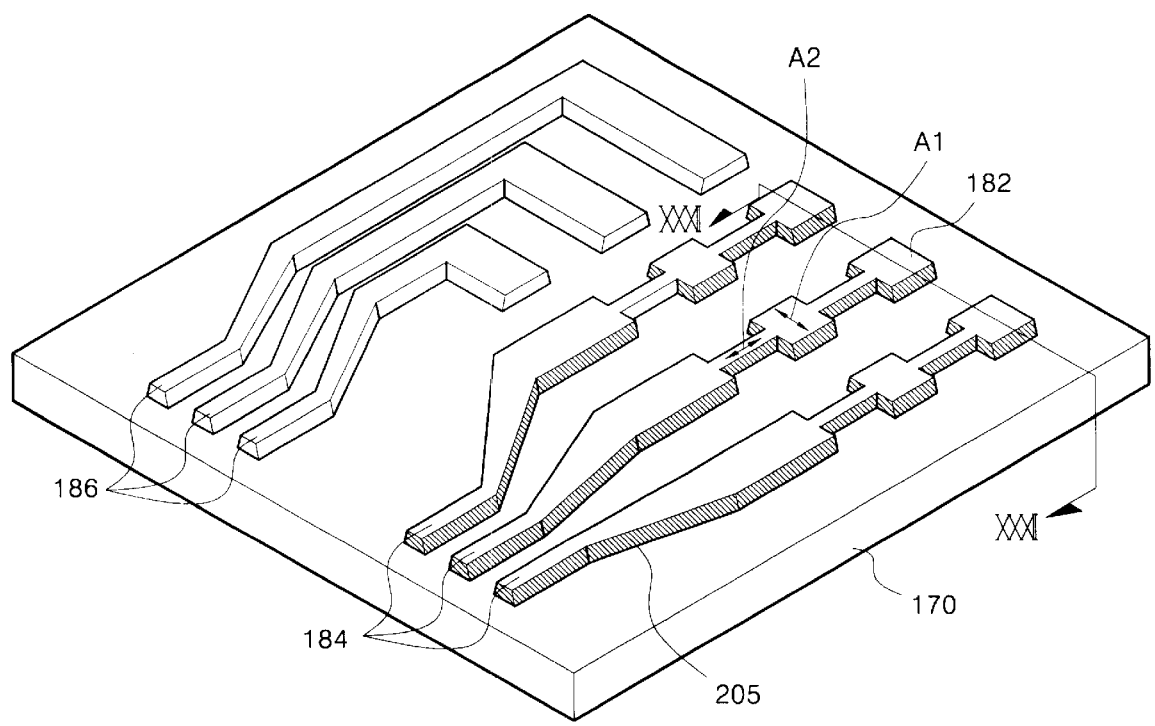
Figure 32:
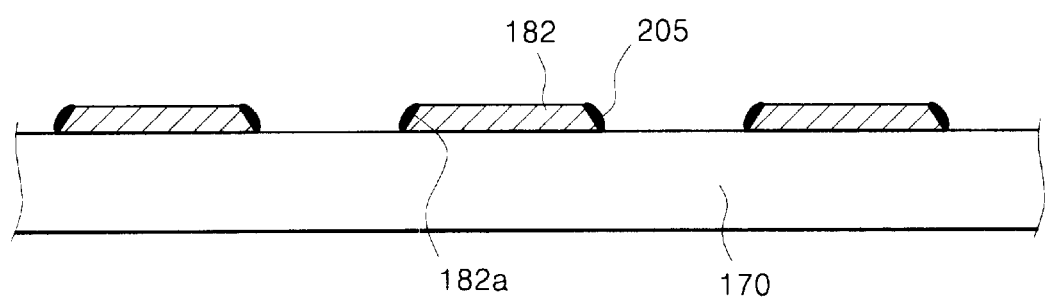

In the meantime, another process of forming the conductive light reflecting layer 205 is shown in FIGS. 29, 30 and 31. As shown in FIG. 29, the anode electrodes 182 are disposed in the form of a matrix, and the adjacent two anode electrodes 182 are electrically connected with each other through a connection pattern 188. The anode electrode leads 184 are connected with the corresponding anode electrodes 182, respectively. The cathode electrode leads are disposed in such a way that one end portion is perpendicular to the anode electrodes 182 and the other end portion is parallel to the anode electrode leads 184. Thereafter, as shown in FIG. 30, the substrate 170 of FIG. 29 on which the anode electrodes 182 and the first photoresist patterns 192 are formed is immersed into an electrobath 220 filled with electrolyte 210. The anode electrodes 182 are connected to a negative pole, and the electrolyte 210 is connected to a positive pole. In this state, voltages are applied so that the anode electrode 182 is plated with a metal material to a predetermined thickness. At this moment, since the first photoresist patterns 192 are formed on a top surface of the anode electrodes 182, a conductive metal is plated on both side portions 182a of the anode electrodes 182 to a predetermined thickness to form a conductive light reflecting layer 205 as shown in FIG. 31. The first photoresist patterns 192 are removed through an ashing process as shown in FIG. 32. In the anode electrode 182 having such a configuration, light waves guided in a direction of the arrow A1 are reflected again by the conductive light reflecting layer 205. Among the light waves guided in a direction of the arrow A2, most of them are reflected again by the conductive light reflecting layer 205, but a small amount of them is wave-guided to be lost. Therefore, an amount of light viewed by observer becomes increased, leading to higher brightness.

Figure 33:
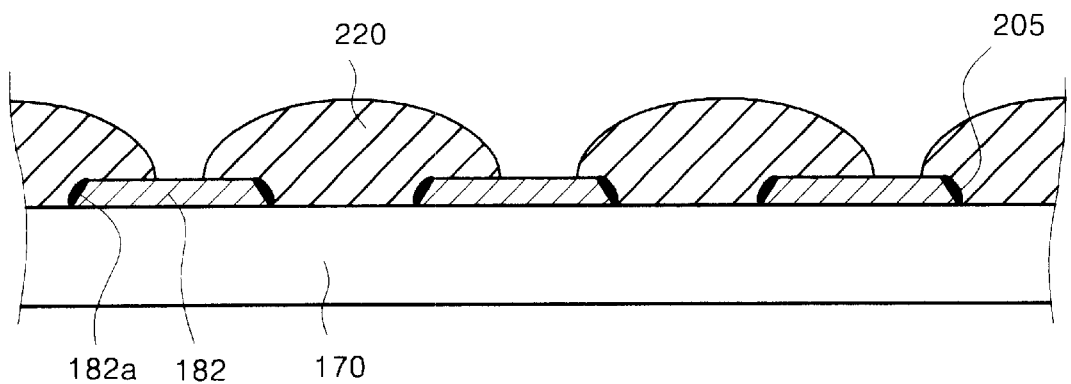
FIG. 33 is a cross-sectional view illustrating a process of forming an insulating layer.

As shown in FIG. 33, insulating layers 220 are formed between the adjacent two anode electrodes 182 while covering the adjacent two conductive light reflecting layers 205.

Figure 34:
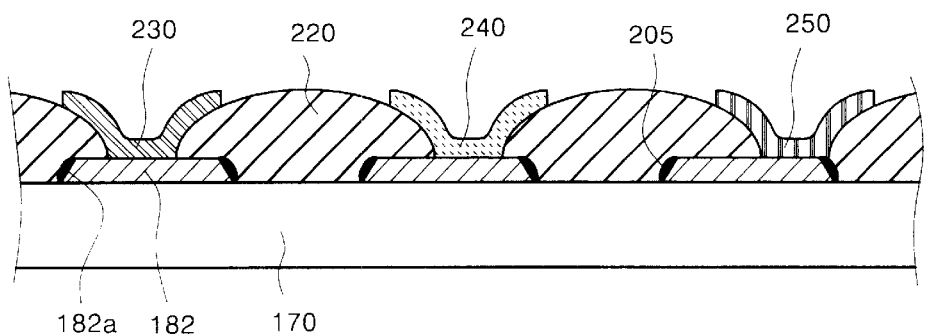
FIG. 34 is a cross-sectional view illustrating a process of forming an EL light-emitting layer.
Figure 35:
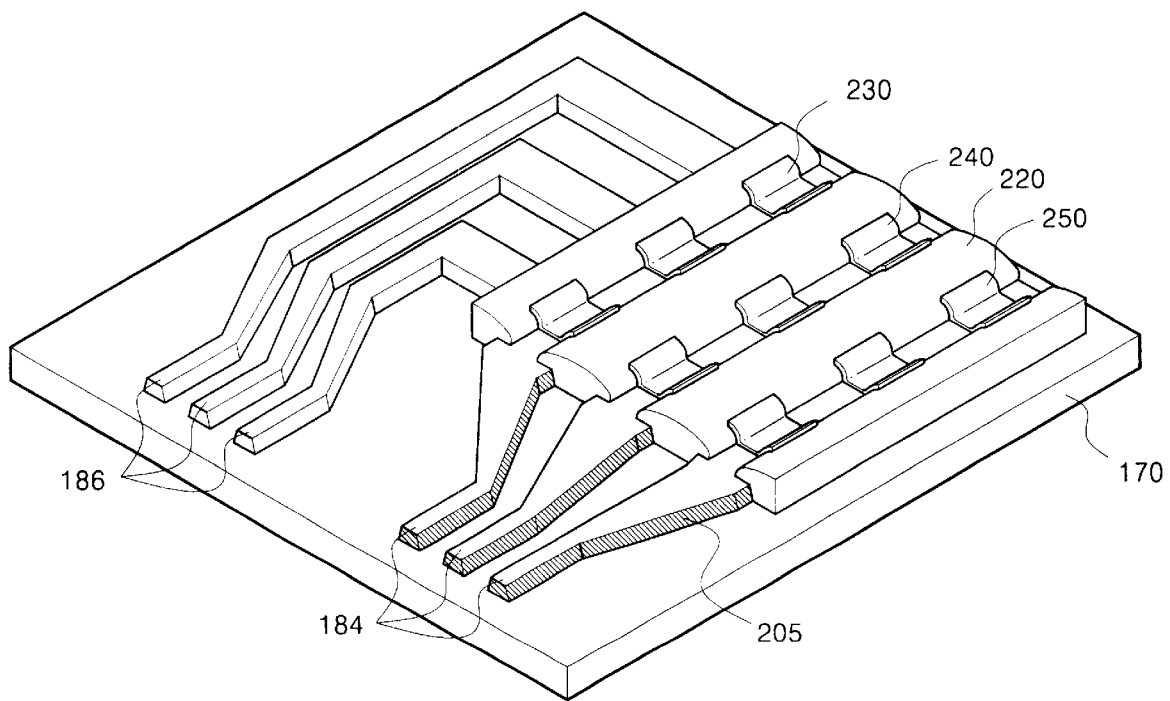
FIG. 35 is a perspective view of FIG. 34.
Figure 36:
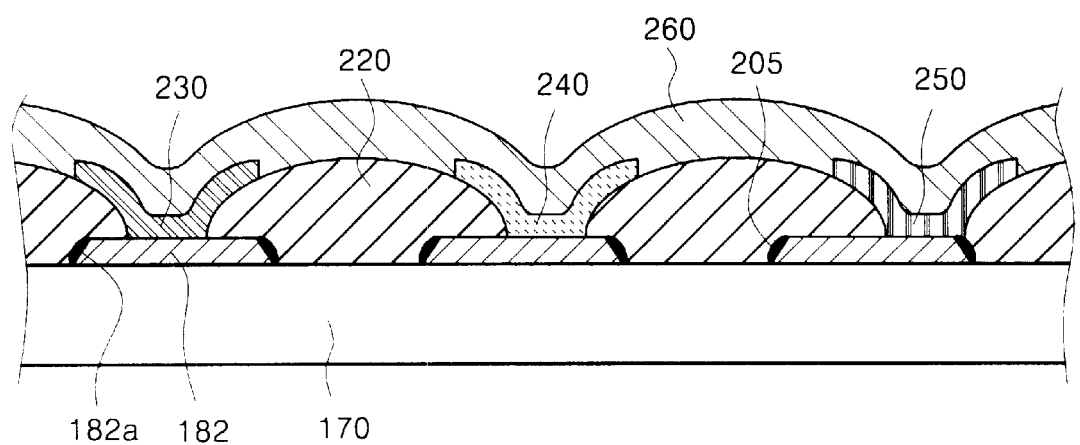
FIG. 36 is a cross-sectional view illustrating a process of forming a cathode electrode.

Subsequently, as shown in FIGS. 34 and 35, EL light-emitting layers 230, 240 and 250 for generating three primary lights (i.e., red, blue and green) are deposited on the anode electrodes 182. A process of forming the EL light-emitting layers is the same as described in FIGS. 13 through 19. A metal layer is deposited while covering the EL light-emitting layers and is patterned into cathode electrodes direction to the anode electrode 182 as shown in FIG. 36. Each of the cathode electrodes 260 is connected with the corresponding cathode lead 186.

Figure 37:
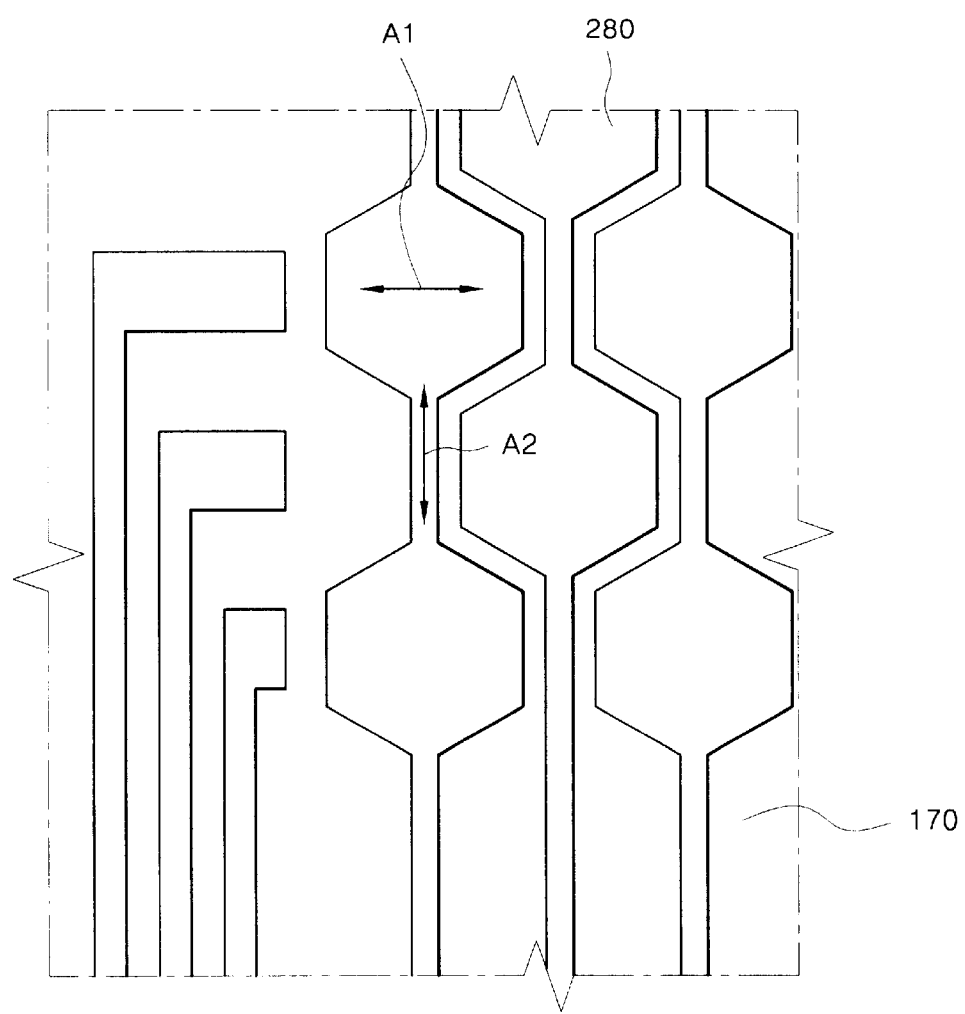
FIG. 37 is a plan view illustrating modified anode electrodes.

FIG. 37 shows anode electrodes 280 formed on the substrate 170 according to a modified embodiment of the present invention. As shown in FIG. 37, the anode electrodes 280 can have a beehive shape. A light reflecting layer can be formed by the manners described above. As described above, in the anode electrode 280 having such a configuration, light waves guided in a direction of the arrow A1 are reflected again by the conductive light reflecting layer 205. Among waves guided in a direction of the arrow A2, most of them are reflected again by the conductive light reflecting layer 205, and a small amount of light is wave-guided to be lost. Therefore, the amount of light viewed by observer becomes increased, leading to higher brightness.

As described herein before, an organic EL device of higher brightness, longer life span, and low power consumption can be manufactured.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An organic EL device, comprising:
   a transparent substrate;
   a first electrode disposed on the transparent substrate;
   a conductive light reflecting layer disposed to cover a side portion of the first electrode;
   an EL light-emitting layer generating light having a predetermined wavelength disposed on the first electrode; and
   a second electrode disposed on the EL light-emitting layer.

2. The device of claim 1, wherein the conductive light reflecting layer is disposed to cover both side portions of the first electrodes.

3. The device of claim 1, wherein the conductive light reflecting layer is disposed to cover all side portions of the first electrodes.

4. The device of claim 1, wherein the conductive light reflecting layer is formed by either depositing or plating a metal layer.

5. The device of claim 1, further comprising an insulating layer disposed between adjacent two first electrodes to cover the conductive light reflecting layer.

6. An organic EL device, comprising:
   a transparent substrate having a display region with a pixel region;
   a first electrode disposed on the display region of the transparent substrate in a first direction and spaced apart from each other;
   a conductive light reflecting layer disposed to expose top portions of the first electrode according to the pixel region of the substrate and covering both side portion of the first electrode parallel to the first direction;
   an EL light-emitting layer disposed on the top portions of the first electrode according to the pixel region; and
   a second electrode disposed in a second direction perpendicular to the first direction and covering the EL light-emitting layers.

7. The device of claim 6, wherein the conductive light reflecting layer is formed by either depositing or plating a metal layer.

8. The device of claim 6, further comprising insulating layers disposed between the adjacent two first electrodes and covering the conductive light reflecting layer.

9. An organic EL device, comprising;
   a transparent substrate; is a first electrode having electrode patterns disposed in a matrix format;
   a conductive light reflecting layer electrically connecting corresponding to electrode patterns to define the first electrode and exposing top portions of the electrode patterns of the first electrodes;
   an EL light-emitting layer disposed on the top portions of the electrode patterns of the first electrodes; and
   a second electrode disposed on the EL light-emitting layers and in a perpendicular direction to the first electrodes.

10. The device of claim 9, wherein the conductive light reflecting layer is formed by either depositing or plating a metal layer.

11. The device of claim 9, further comprising insulating layers disposed between the adjacent two first electrodes and covering the conductive light reflecting layer.

12. An organic EL device, comprising:
   a transparent substrate;
   a first electrode having a first portion and a second portion, the first portion being wider than the second portion;
   a conductive light reflecting layer disposed to cover a side portion of the first electrodes;
   an EL light-emitting layer disposed on the first portion of the first electrode; and
   a second electrode disposed on the EL light-emitting layer and in a perpendicular direction to the first electrode.

13. The device of claim 12, wherein the conductive light reflecting layer is formed by either depositing or plating a metal layer.

14. The device of claim 12, further comprising an insulating layer disposed between two adjacent first electrodes and covering the conductive light reflecting layer.

15. The device of claim 12, wherein the first electrode has a beehive shape.

* * * * *